Figure 1:
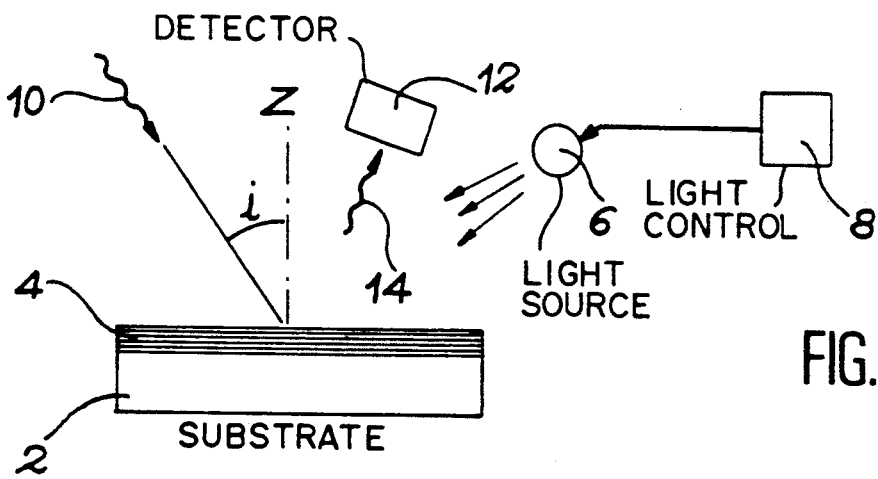

United States Patent [19]

Gerard et al.

[11] Patent Number: 5,160,992
[45] Date of Patent: Nov. 3, 1992

[54] DEVICE FOR THE CONVERSION OF AN INFRARED RADIATION INTO ANOTHER RADIATION OF ENERGY GREATER THAN THAT OF THIS INFRARED RADIATION

[75] Inventors: Jean-Michel Gerard, Paris; Jean-Yves Marzin, Orsay, both of France

[73] Assignee: Minister of Post, Telecommunications and Space, France

[21] Appl. No.: 619,704

[22] Filed: Oct. 31, 1990

[30] Foreign Application Priority Data

Dec. 28, 1989 [FR] France ................. 89 17325

[51] Int. Cl.$^5$ ................. H01L 33/00; H01L 27/12
[52] U.S. Cl. ................. 359/326; 257/80; 257/21
[58] Field of Search ................. 357/17, 30; 307/425; 350/1.1, 353, 354; 342/53; 359/326

[56] References Cited

U.S. PATENT DOCUMENTS

| | | | |
|---|---|---|---|
| 4,364,014 | 12/1982 | Gray | 330/4.3 |
| 4,761,620 | 8/1988 | Joseph et al. | 350/354 |
| 4,803,537 | 2/1988 | Lewis et al. | 357/30 E |
| 4,905,059 | 2/1990 | Shur | 357/17 |
| 4,999,682 | 3/1991 | Xu et al. | 357/20 |

FOREIGN PATENT DOCUMENTS

| | | |
|---|---|---|
| 0299841 | 1/1989 | European Pat. Off. . |
| 0345972 | 12/1989 | European Pat. Off. . |

OTHER PUBLICATIONS

Gerard et al., "High Quality . . . Beam Epitaxy"; Aug. 15, 1988, APL, vol. 53, #7, pp. 568-570; abst. only provided.
Zhang et al., "Miniband-gap Optical . . . Superlattices"; Solid State Commun., vol. 71, #8, pp. 643-647, 1989; abst only provided.
Electronics Letters, vol. 25, No. 16, 1989, pp. 1063-1065 E. Rosencher et al., "Second Harmonic Generation by . . . ".
Applied Physics Letters, vol. 55, No. 16, 1989, pp. 1597-1599, E. Rosencher et al., "Observation of Nonlinear . . . ".
Applied Physics Letters, vol. 51, No. 25, 1987, pp. 2100-2102, J. Khurgin, "Second Order Susceptibility of . . . ".
Applied Physics Letters, vol. 52, No. 20, 1988 pp. 1701-1703, D. W. Goossen et al. "Photovoltaic . . . ".

*Primary Examiner*—Nelson Moskowitz
*Attorney, Agent, or Firm*—Kerkam, Stowell, Kondracki & Clarke

[57] ABSTRACT

A device for the conversion of infrared radiation into another form of radiation of energy greater than that of the infrared radiation comprises a multilayer semiconductor structure (4) comprising at least two layers in which an electron gas and a gas of holes which are regenerated in the course of the use of the device are combined. There is at least one delocalized electron state in the structure, at an energy greater than the energy of the ground state of the electron gas, the difference between these energies being within the infrared range. When the structure is illuminated at a non-normal incidence by radiation (10), the energy of which is equal to this difference, the structure emits a radiation (14) of greater energy, by radiative recombination involving the holes. The device finds suitable application in infrared imaging systems.

21 Claims, 6 Drawing Sheets

DEVICE FOR THE CONVERSION OF AN INFRARED RADIATION INTO ANOTHER RADIATION OF ENERGY GREATER THAN THAT OF THIS INFRARED RADIATION

DESCRIPTION

The present invention relates to a device for the conversion of an infrared radiation into another radiation of energy greater than that of this infrared radiation. It is applicable, in particular, to the construction of infrared imaging system.

The article by E. Rosencher et al., published in Electronics Letters No. 16, vol. 25, p. 1063 (1989), has already disclosed a device incorporating a quantum well with three equidistant levels, this device permitting the doubling of the frequency of an infrared radiation.

The subject of the present invention is a semiconductor conversion device, the parameters of which can be selected in the course of the manufacture thereof, in such a manner that it is capable of converting an infrared radiation of energy E1 determined in advance into another infrared or visible radiation, of energy E2 greater than E1 and determined in advance in a manner substantially independent of E1.

The invention permits, for example, the conversion of a radiation, the wavelength of which is included within the range extending from approximately 4 to 40 micrometers, into another radiation, the wavelength of which is included within the range extending from approximately 0.7 to 1.5 micrometer.

It is possible to construct the device forming the subject of the invention in such a manner as to have an output, in terms of the number of photons, close to 50% and a response time of the order of 1 ns.

In precise terms, the subject of the present invention is a device for the conversion of an infrared radiation into another radiation of energy greater than that of this infrared radiation, characterized in that it comprises a multilayer semiconductor structure comprising at least one first semiconductor layer and at least one second semiconductor layer, in which layers there are respectively confined an electron gas and a gas of holes, or in which layers it is possible to confine respectively an electron gas and a gas of holes, the structure being such that there is at least one delocalized electron state in at least the first and the second layers, this delocalized state having an energy greater than that of the electrons of the electron gas, the difference between the energy of the delocalized state and that of the ground state of the electron gas being within the infrared range, so that when the structure is illuminated in a manner not perpendicular to the layers by a first radiation which is within the infrared range and the energy of which is equal to the difference between the energy of the delocalized state and that of the ground state of the electron gas, this structure emits a secondary radiation of energy greater than that of the first, by radiative recombination involving the holes of the gas of holes, and in that the device further comprises means for regenerating, or for creating before use of the device and then regenerating, the electron gas and the gas of holes.

As will be better understood in the text which follows, when the device is such that the electron gas and the gas of holes are, before use of the device, (substantially) confined within the corresponding layers, it is appropriate, after a certain time, to regenerate these gases of electrons and of holes, using the means provided for this purpose.

When the device is such that, before its use, the electron gas and the gas of holes are not present within the corresponding layers, it is appropriate to create them and to regenerate them after a certain time, using the means provided for this purpose.

According to a first particular embodiment of the device forming the subject of the present invention, the structure is a symmetrical structure, the first and the second layers of which respectively form coupled quantum wells, of the same depth and doped, their respective dopings being of opposite types, the device then comprising means for regenerating the electron gas and the gas of holes.

In this case, in a particular construction, the first layer is made of a semiconductor material with N-type doping, the second layer is made of this same semiconductor material but with a P-type doping, and the first layer and the second layer are separated by a third semiconductor layer which is not doped intentionally and which forms a potential barrier for the electrons and for the holes, the assembly comprising the first, the second and the third layers being framed by two semiconductor layers which are not doped intentionally, forming potential barriers for the electrons and for the holes.

According to a second particular embodiment of the device forming the subject of the present invention, the structure is an asymmetric structure, or one capable of being made so, the first and the second layers of which respectively form coupled quantum wells, which are not doped intentionally, where the ground level of electrons and the ground level of holes are, or are capable of being, for the most part confined respectively within the first and the second layers, the device then comprising means for creating, before use of the device, and then regenerating the electron gas and the gas of holes.

In order to increase the efficiency of the absorption of the first radiation, it possible to use various particular constructions separately or in combination:

the structure may comprise a plurality of patterns, each pattern comprising the first and the second semiconductor layers, the structure may rest on a substrate transparent to the first and second radiations and may comprise a free surface which is made optically reflective in relation to the first radiation, the structure may rest on a substrate which is transparent to the first radiation and one end of which is bevelled and intended to receive this first radiation.

Finally, said means may be illumination means provided for illuminating the structure by a radiation capable of regenerating, or creating before use of the device and then regenerating, the electron gas and the gas of holes.

Figure 7:
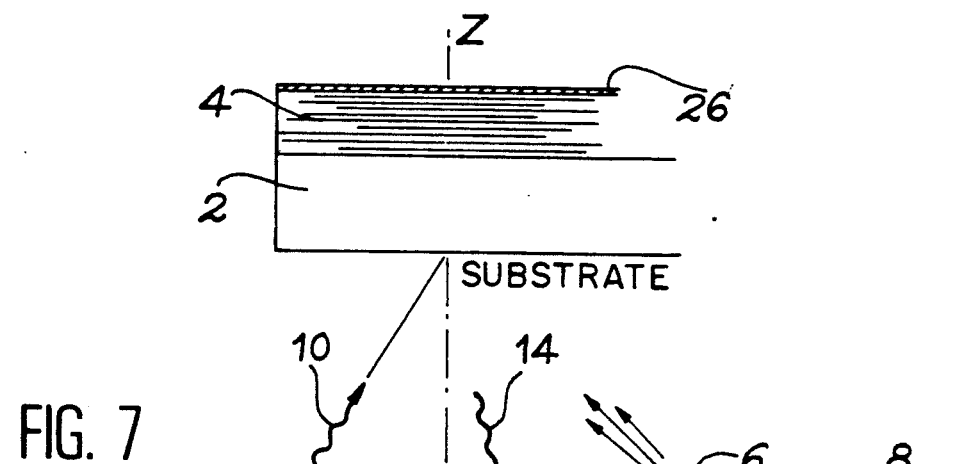
Figure 8:
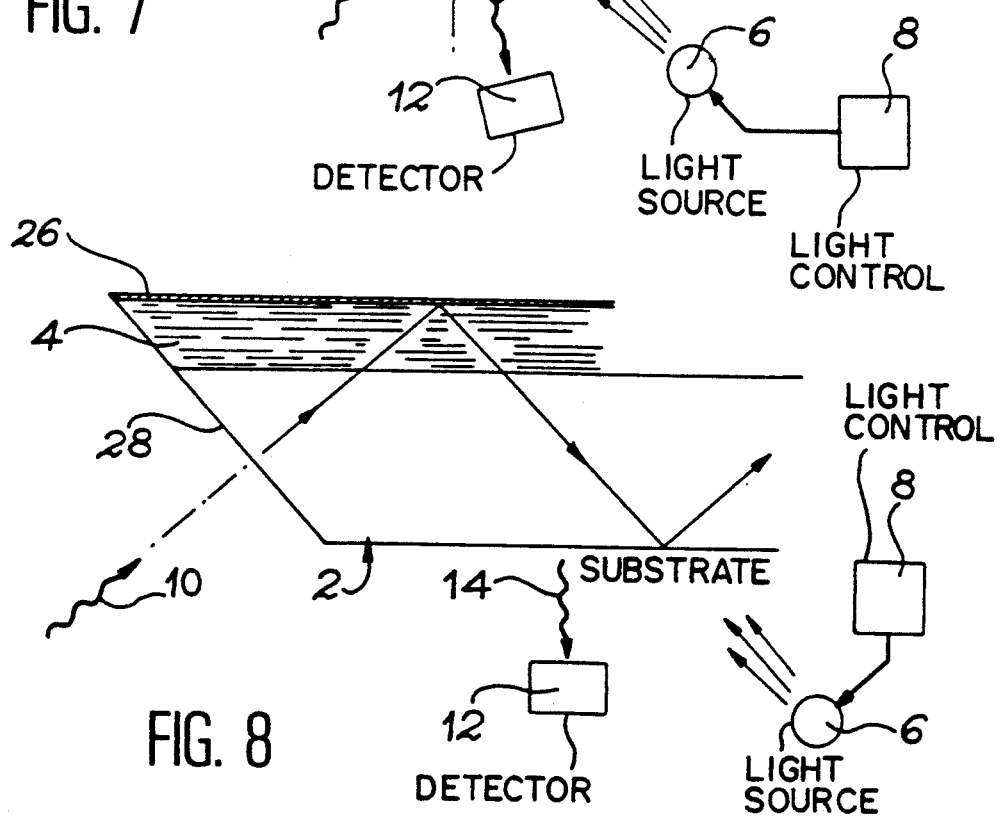
Figure 2:
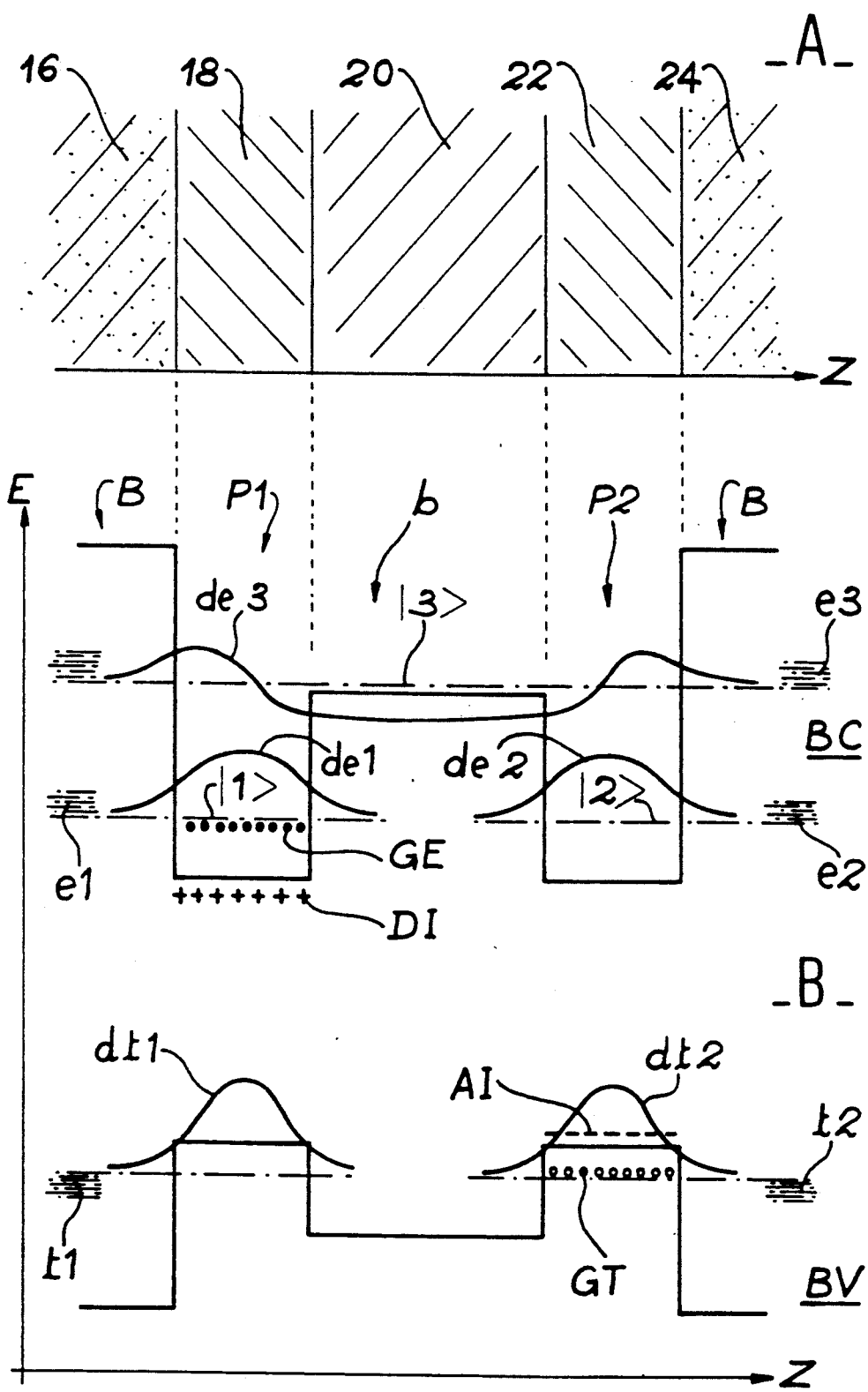
Figure 3:
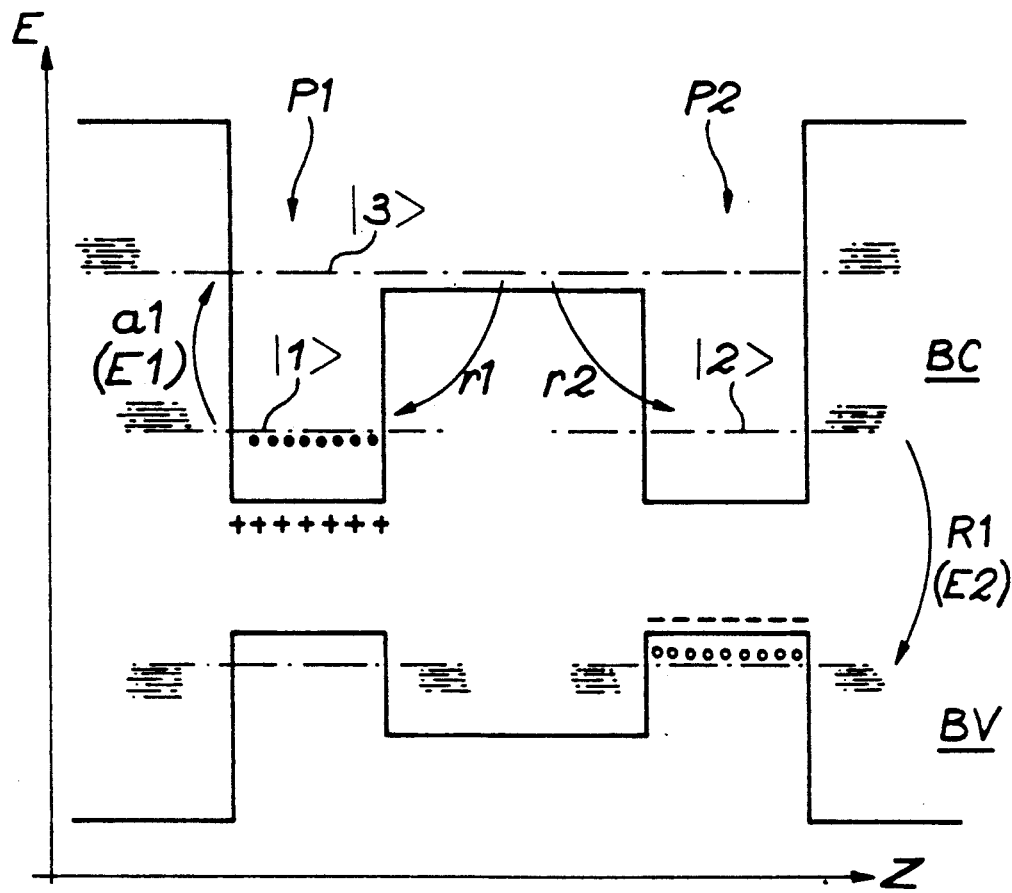
Figure 4:
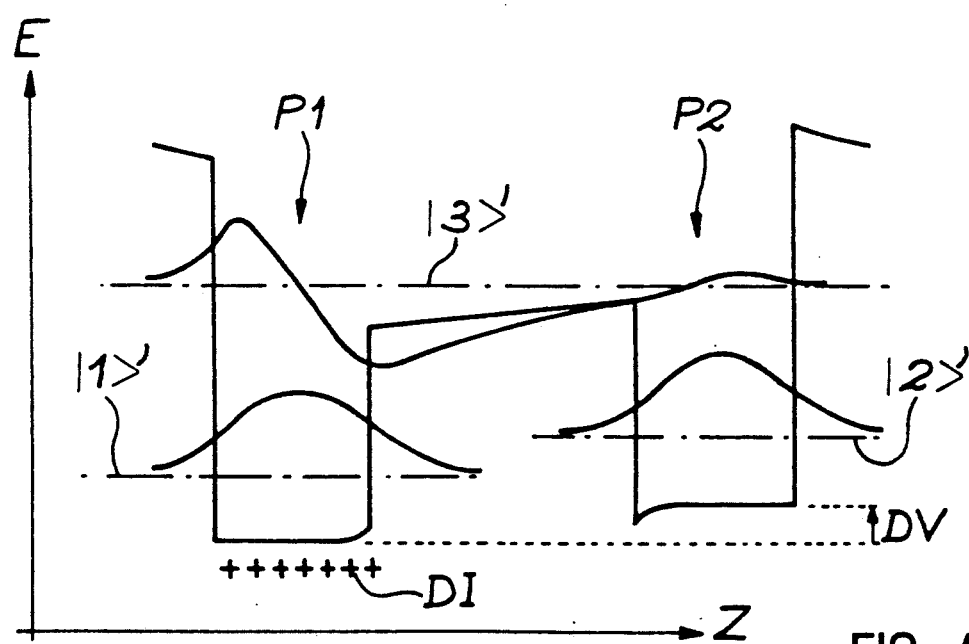
Figure 5:
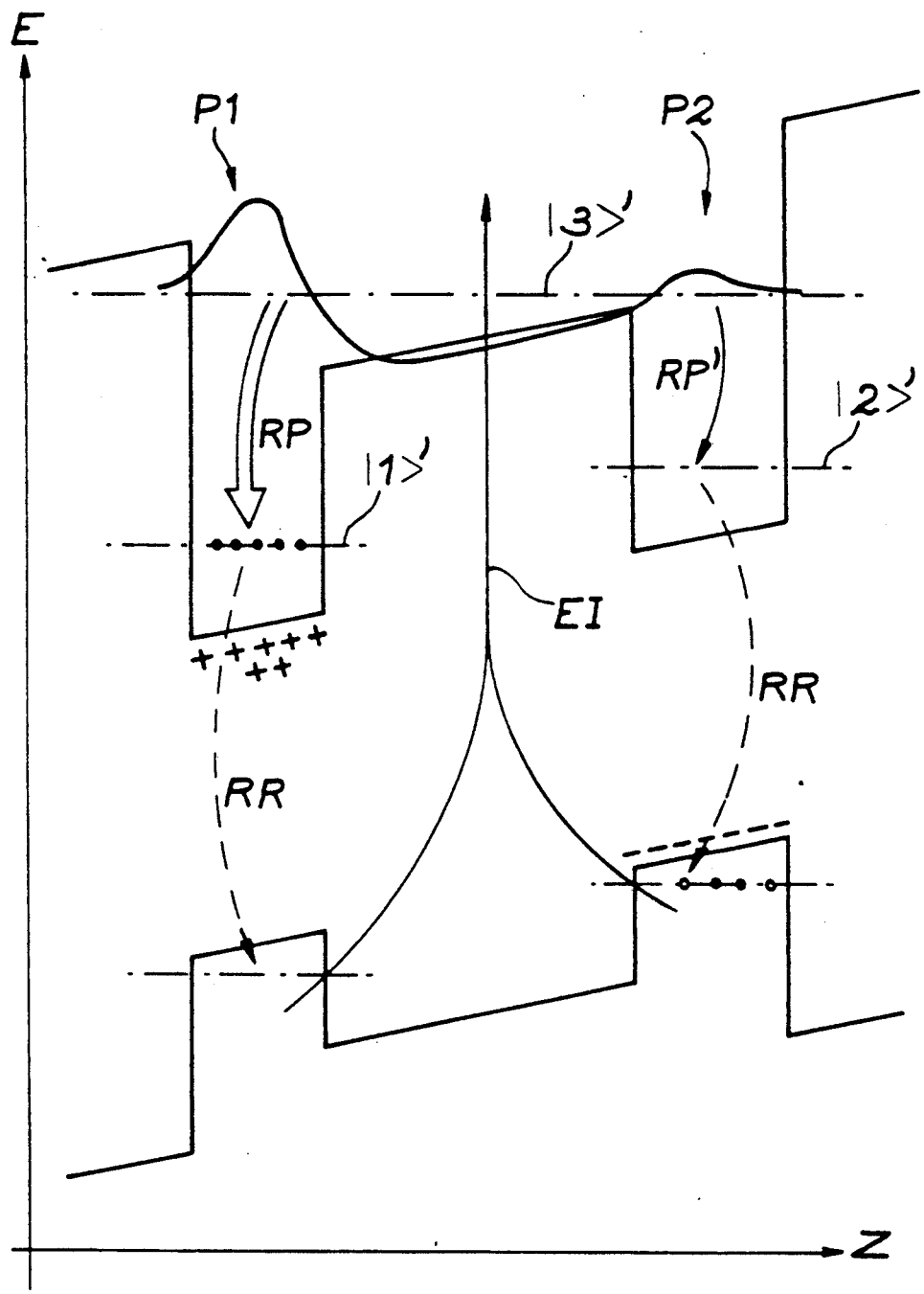
Figure 6:
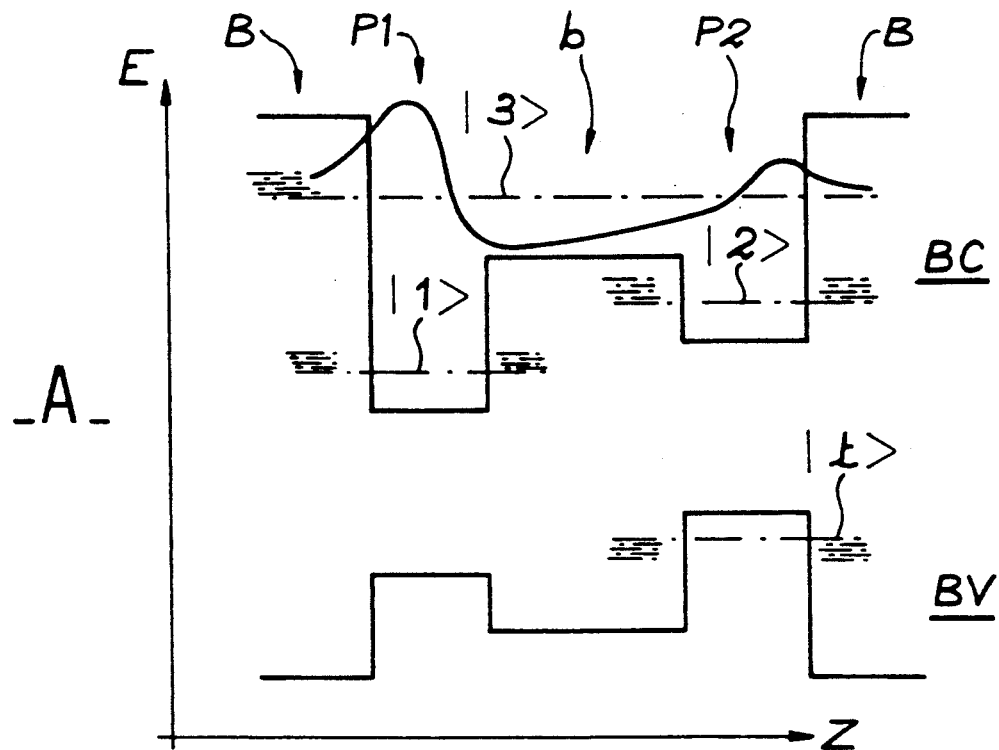
Figure 6:
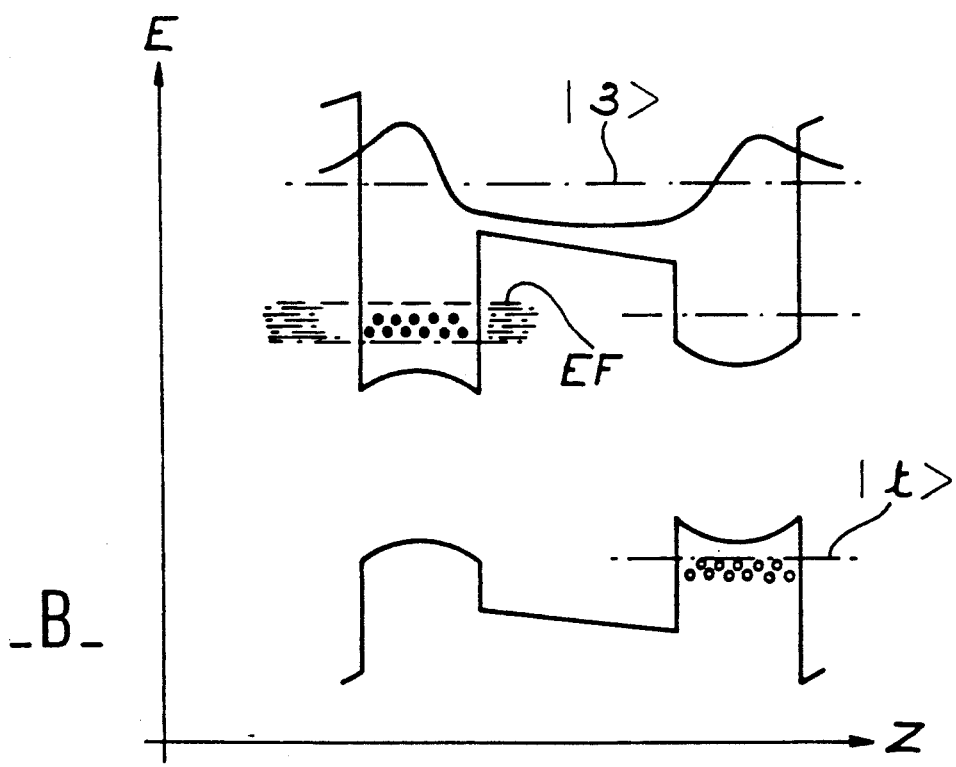
Figure 9:
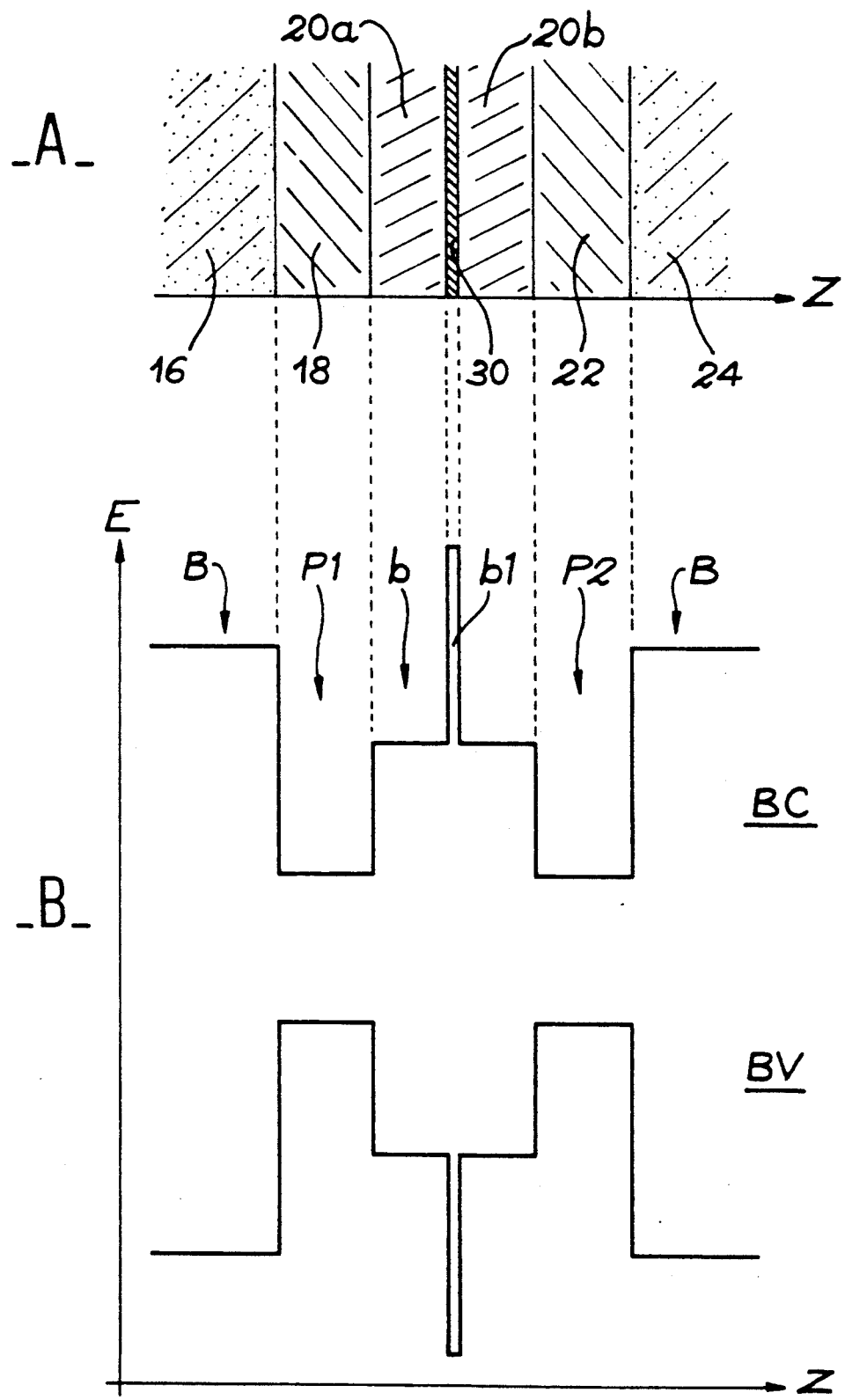

The present invention will be better understood on reading the description of illustrative embodiments given hereinbelow on a purely indicative and in no sense limiting basis with reference to the accompanying drawings in which:

FIG. 1 is a diagrammatic view of a particular embodiment of the device forming the subject of the invention, FIG. 2 diagrammatically illustrates a stack of semiconductor layers permitting the implementation of the invention (A) as well as the band structure associated with this stack (B), FIG. 3 diagrammatically illustrates the elementary processes leading to the conversion of an infrared radiation into another radiation of energy greater than that of this infrared radiation, by means of a device according to the invention, comprising the stack represented in FIG. 2, FIG. 4 diagrammatically illustrates the structure of the conduction band and the form of the wave functions of various energy levels in the course of the shutdown of the device comprising this stack, FIG. 5 diagrammatically illustrates the elementary processes participating in the operation of regeneration of the electron gas and of the gas of holes in this device, by appropriate illumination means, FIG. 6 diagrammatically illustrates the band structure of another device according to the invention, comprising an asymmetric and undoped semiconductor structure, this band structure being represented before generation of the gases of electrons and of holes (A) and after this generation (B), FIG. 7 diagrammatically illustrates another device according to the invention, comprising a semiconductor structure, a free surface of which is optically reflective in relation to the infrared radiation which it is desired to convert, FIG. 8 diagrammatically illustrates another device according to the invention, comprising a semiconductor structure on a substrate which is bevelled and transparent to the infrared radiation which it is desired to convert, and FIG. 9 diagrammatically illustrates another stack of layers which it is possible to use in the present invention (A) and the various wells and barriers which are obtained with this stack (B).

FIG. 1 shows diagrammatically a conversion device according to the invention, which comprises, on a substrate 2, an appropriate multilayer semiconductor structure 4, the layers of which are stacked along an axis Z and examples of which will be given hereinbelow.

The device represented in FIG. 1 further comprises a light source 6 intended to illuminate the structure by a radiation permitting the regeneration, within the structure, of an electron gas and a gas of holes which are necessary for the conversion. Appropriate means 8 are provided for controlling the light source 6 in such a manner that the latter illuminates the structure 4 in general periodically.

The infrared radiation 10 which it is desired to convert is passed onto the structure 4 in a manner not perpendicular to the layers of this structure 4: the angle of incidence i of this radiation is not zero. This angle i is the result of a compromise between the need to obtain good penetration of the radiation 10 into the structure and the need to obtain good absorption of this radiation 10 by this structure. The angle i may be equal to the BREWSTER angle relating to the structure 4.

FIG. 1 also shows means 12 for detecting the radiation 14 resulting from the conversion of the radiation 10 by the structure 4. These detecting means 12 are, for example, placed above this structure 4.

The device represented in FIG. 1 may form part of an infrared imaging system. In this case, the device permits the conversion of an infrared image into an image of the near infrared or into a visible image. The image obtained may be passed optically onto a matrix of photodetectors or of light amplifiers, which is commercially available and which then constitutes the detecting means 12.

It is stated that the multilayer semiconductor structure 4 which is in fact a heterostructure, satisfies the following conditions:

the presence, within this structure, of at least one first layer containing an electron gas and of at least one second layer containing a gas of holes, the existence of a delocalized electronic state within at least this first and this second layers respectively containing an electron gas and a gas of holes.

The elementary properties of the heterostructure which are utilized in the course of the conversion operation are the following:

the phenomenon of inter-miniband absorption at the energy E1 (energy of the radiation to be converted) within the heterostructure, a phenomenon which permits the transfer of an electron from the ground level of the electron gas to the delocalized excited state mentioned previously, the phenomenon of radiative recombination at the energy E2 (energy of the radiation 14 emitted by the structure), which may take place if the electron is transferred into a layer containing a gas of holes.

As, in the course of the operation of the device of FIG. 1, a transfer of charges takes place within the structure 4, from the layer(s) containing electrons to the layer(s) containing holes, a polarization of the structure takes place in the course of this operation.

It is for this reason that the device of FIG. 1 comprises the light source 6 which is, for example, a high-power lamp and which is selected so as to emit a radiation of energy greater than or equal to E1+E2 in the direction of the structure, in order to "cancel" the polarization and thus to regenerate the conversion device.

Generally, this regeneration is periodic, the frequency of illumination of the structure 4 by the source 6 being a function of the intensity of the incident infrared radiation 10.

In fact, as has already been stated, in certain structures according to the invention the electron gas and the gas of holes do not exist naturally in such structure and must therefore be created with a view to such utilization. To this end, use is made of the source 6 which is then used for the generation of the device.

A detailed explanation is given hereinbelow of the operation of a conversion device according to the invention in the case of a simple semiconductor structure.

FIG. 2-A diagrammatically illustrates this structure which is a stack of five different semiconductor layers 16, 18, 20, 22 and 24 stacked in this order one on the other and forming a double well.

The layers 16 and 24 are identical layers, which are not doped intentionally and which each form a potential barrier for the electrons (barrier B) and for the holes, the layer 16 resting on the substrate 2.

The central layer 20 is a semiconductor layer which is not doped intentionally, formed an intermediate potential barrier for the electrons (b) and for the holes, which separates the two wells of the structure and the height of which is, for the electrons, less than that of the barrier (B).

The layers 18 and 22 respectively form wells P1 and P2 and the doping of the layer 18 is of N-type, while the layer 22 is made of the same semiconductor material as the layer 18 but has a P-type doping. Furthermore, the two wells P1 and P2 have the same width and the same depth.

FIG. 2-B shows a diagram representing the energy E of the electrons of the structure of FIG. 2-A and the configuration of the conduction band BC and the configuration of the valence band BV which are associated with this structure as a function of the position on the axis Z oriented from the layer 16 towards the layer 24.

The first, second and third minibands of electrons of the structure of FIG. 2-A respectively bear the reference e1, e2 and e3. The lowest energy levels of the minibands e1, e2 and e3 respectively bear references $|1>$, $|2>$ and $|3>$.

A representation has also been given of the wave functions de1, de2 and de3 corresponding respectively to the levels $|1>$, $|2>$ and $|3>$.

FIG. 2-B also shows the ionized donors D1 of the layer 18 and the electron gas GE which populates the miniband e1 with effect from the level $|1>$.

FIG. 2-B also shows the first miniband of holes t1 and the second miniband of holes t2 within the valence band BV and the wave functions dt1 and dt2 corresponding respectively to the ground level of the miniband t1 and to the ground level of the miniband t2.

The ionized acceptors within the layer 22 bear the reference AI and, within this layer 22, a gas of holes populates the miniband t2 with effect from the ground level of the latter.

The parameters of the structure of FIG. 2-A (respective widths and heights of the intermediate barrier which is formed by the layer 20 and wells P1 and P2) are adjusted so that, in the absence of transfer of charge from well to well, the electron levels $|1>$ and $|2>$ of the structure are essentially localized within the wells P1 and P2 respectively. For a broad intermediate barrier (layer 20), this result is obtained as soon as these levels exhibit a small energy difference in relation to one another, since, then, their coupling due to the tunnel effect is negligible.

Furthermore, the structure is such that the level $|3>$ is at an energy greater than the height of the intermediate barrier b and thus delocalized within the double well. In fact, this level $|3>$ could be at an energy slightly less than the height of the intermediate barrier b.

The conditions presented in the two preceding paragraphs are quite easy to satisfy, and an indication will be given hereinbelow of a plurality of series of materials and of parameters satisfying these conditions for various pairs E1, E2.

In the four examples of symmetrical semiconductor structures given hereinbelow, the layers are stacked on a substrate made of a material compatible with the material making up the layers 16 and 24 and the stacking of the five layers is, for example, obtained by epitaxy using molecular beams (MBE).

To provide a detailed illustration of the operation of a device according to the invention comprising a stack of the same type as that of FIG. 2-A, the following parameters are selected:

First example of a semiconductor structure

Conversion of a radiation of 144 meV (8.6 micrometers) into a radiation of 1.602 eV (0.77 micrometer)
layers 16, 24: $Ga_{0.6}Al_{0.4}As$
layer 18: 6 nm of GaAs which is N-doped at $3.3 \cdot 10^{17}$ $cm^{-3}$
layer 20: 10 nm of $Ga_{0.77}Al_{0.23}As$
layer 22: 6 nm of GaAs which is P-doped at $3.3 \cdot 10^{17}$ $cm^{-3}$ Substrate: GaAs In this first example, the electron gas and the gas of holes both have a surface density of $2 \cdot 10^{11}$ $cm^{-2}$.

FIG. 2-B diagrammatically represents the band structure of the double well obtained, in the absence of transfer of charge from well to well. There are then as many electrons as ionized donors within the layer 18 and as many ionized acceptors as holes within the layer 22.

This band structure is very close to a structure having the same parameters, but not doped, since the various layers have a neutral total charge.

With regard to this band structure, it will be noted that the exchange energy for the electron gas is close to 20 meV per electron. This renormalization of the position of the level $|1>$ displaces the energy of the latter in relation to the level $|2>$ and thus entirely decouples these levels $|1>$ and $|2>$.

Furthermore, the density of states which is associated with a given miniband of a quantum well is closed to $10^{10}$ states per $cm^2$ and per meV.

The FERMI level EF of the electrons is thus situated at 20 meV above the base of this miniband. This means that the electrons situated at the FERMI level are stable in relation to a transfer into the adjoining well (and thus remain within the well P1 in the absence of the infrared radiation 10 which it is desired to convert).

Likewise, the holes of the gas of holes occupying first states of the miniband t2 are stable in relation to their transfer to the miniband t1.

The key to the operation of the conversion device comprising the semiconductor structure of FIG. 2-A resides in the possibility of absorbing a low-energy photon by an inter-miniband excitation which urges an electron from a state of the miniband e1, which state is principally localized within the well P1, into a delocalized state of the miniband e3.

This electron has a short relaxation time (at the most a few tens of picoseconds) to the minibands e1 or e2 and mutually very close probabilities of falling back into a ground level of the well P1 or of the well P2 (state $|1>$ or state $|2>$), since its probability of presence is the same in the vicinity of either well.

The relaxation processes which are possible are inter-miniband coupling (emission of an infrared photon) and relaxation with emission of phonons (the latter process being most effective if the difference between the energy of the level $|3>$ and the energy of the level $|1>$ or of the level $|2>$ is greater than the energy of the optical phonon, this energy being of the order of 35 to 40 meV).

The electrons thus captured by the well P2 recombine radiatively with holes of the gas of holes which is present within the well P2.

It is thus sufficient to adjust the parameters of the semiconductor structure in such a manner that the energy E1 corresponds to the energy of the inter-miniband transition ($|1>$ to $|3>$) and that the energy E2 corresponds to the energy of the inter-band transition between the level $|2>$ and the ground level of the miniband of holes t2.

The various elementary processes which participate in the conversion operation are summarized in FIG. 3.

In this FIG. 3, an arrow a1 symbolizes the inter-miniband absorption (energy E1), arrows r1 and r2 symbolize the possible inter-miniband relaxations and an arrow R1 symbolizes the inter-band recombination leading to the emission, by the semiconductor structure, of a radiation of energy E2 greater than E1.

As regards the speed of such a conversion device, the times utilized are of the order of 1 picosecond for the transfer (level $|1>$ to level $|3>$ and of the order of 1 nanosecond for the radiative recombination (level $|2>$ to first level of holes of the miniband t2). Accordingly, it is the latter phenomenon which limits the operation in terms of frequency.

The conversion device concerned is efficient. In fact, approximately one in two of the photons of energy E1 which are absorbed by the semiconductor structure is converted into a photon of energy E2 in the initial phase of operation.

As will be seen hereinbelow, the efficiency of the absorption phase may be increased at will by increasing the number of pairs of wells or by using multiple passes of the incident infrared beam on the semiconductor structure.

The devices or configurations which maximize such an absorption in the case of the known infrared detectors, based on semiconductor heterostructures, may be used in the present case.

In the course of the operation of the conversion device, an internal electric field appears. In fact, a positive total charge Q expressed in coulombs per cm² is created within the well P1 and an opposite charge $-Q$ is created within the well P2. These charges Q and $-Q$ induce a potential difference DV between the two wells, of the order of:

$$DV = Q \cdot d/(E_0 \cdot E_r)$$

where d is the thickness of the intermediate layer 20 and $E_0$ and $E_r$ respectively represent the dielectric constant of a vacuum and the relative permittivity of the semiconductor structure.

A novel configuration of the band structure (diagrammatically represented for the conduction band in FIG. 4) results from this transfer of charges. The levels $|1>$, $|2>$ and $|3>$ are respectively transformed into levels $|1>'$, $|2>'$ and $|3>'$.

The form of the presence probability density in the delocalized level $|3>'$ is also transformed; it is greater at the level of the well P1 than at the level of the well P2. The efficiency of the transfer of the electrons urged at the level $|3>'$ towards P2 thus diminishes.

In consequence, the operation of the conversion device ceases:

when the electron gas is entirely depleted (the case where the wells have little doping), or when the internal field created is so strong that transition takes place to a regime in which the first level of electrons of the well P2 (state $|2>$) becomes delocalized in the structure.

On the other hand, at this stage of the operation of the conversion device, the energies of the useful transitions (E1, E2) are significantly disturbed.

In the case of the first example given hereinabove, wherein Q is equal to $2 \cdot 10^{11}$ coulombs per cm² (cessation of the operation by depletion of the electron gas), the potential difference DV obtained is of the order of 28 mV.

The new positions $|1>'$, $|2>'$, $|3>'$ of the electron levels, which are indicated in FIG. 4, correspond to the case where this charge Q has been transferred.

It is thus appropriate to introduce a sequence of regeneration of the device in the course of the use of the latter.

In order to do this, use is made of an optical excitation of the semiconductor structure at an energy greater than or equal to E1+E2, that is to say greater than the energy of the inter-band transitions involving the first level of holes and the delocalized level $|3>'$.

Electrons are thus photoexcited in the level $|3>'$ and holes photocreated in the minibands t1 and t2. The electrons occupying the level $|3>'$ have a greater probability of relaxing to the level $|1>'$ than to the level $|2>'$, since their probability of presence is far greater in the vicinity of the first layer (the N-doped layer).

After relaxation to the base of the band, that is to say to the level $|1>'$ or the level $|2>'$, the photoexcited electrons recombine with the holes localized with the same well.

The equilibrium situation achieved at the end of the optical regeneration sequence is such that the probabilities of relaxation of the electrons from the level $|3>'$ to the levels $|1>'$ and $|2>'$ are the same.

The duration of the regeneration phase is of the order of 1 nanosecond for the irradiation (a reasonable power of 1 kW/cm² permitting the creation of $10^{13}$ electron-hole pairs in one nanosecond) and of the order of 20 ns for the dead time necessary for the recombination of almost all the electrons and the holes created in large excess during the optical excitation phase.

In these circumstances, the situation is once again that of FIG. 2-B.

This technique of optical excitation of the semiconductor structure actually permits the regeneration of the conversion device.

The various elementary processes leading to the regeneration operation are diagrammatically represented in FIG. 5.

In this FIG. 5, the arrow EI represents the inter-band excitation, the arrows RP and RP' represent the relaxation of the photocreated carriers and the arrows RR represent the radiative recombination of the excess carriers.

The regeneration sequence brings the structure into an unstable state, out of equilibrium, since the FERMI level is not at the same position for the two wells P1 and P2.

Apart from the operation as conversion device, two extraneous phenomena tend to bring the semiconductor structure back to thermodynamic equilibrium.

One of these phenomena is the relaxation, within the well P2, of electrons thermally excited from the level $|1>$ to the level $|3>$. The rate of disappearance dN/dt of the population N from the electron gas is of the order of N.beta/tau, where beta is the BOLTZMANN factor $(\exp(-E1/(kT)))$ for the level $|3>$ and tau is the inter-miniband relaxation time from the level $|3>$ to the level $|2>$.

This first phenomenon may be limited by lowering the temperature of operation of the conversion device, without going as far as the temperature Td of trapping of the electrons on the donors.

The binding energy of an electron on a donor is within the range of between 3 and 6 meV and Td is of the order of 30K.

For the semiconductor structure corresponding to the first example given hereinabove, when this structure is at a temperature is at a temperature of 77 K, beta is of the order of $3 \cdot 10^{-9}$ and tau is of the order of a few picoseconds. The characteristic time of the thermal leakage which is established by the first extraneous phenomenon is of the order of $10^{-3}$ second and is thus very large as compared with the response time of the conversion device.

The second extraneous phenomenon is the radiative recombination between electrons and holes of the gases confined, since the probability of presence associated with these confined levels is small but not zero in the remainder of the structure.

The amplitude of this second extraneous phenomenon is very small as soon as the first levels $|1>$ and $|2>$ of the wells P1 and P2 are at energies which slightly differ from one another.

For the device corresponding to the first example given hereinabove, a difference of 1 meV (or 5 meV respectively) between these energies leads to a radiative lifetime which is 100 times (or 2,000 times respectively) greater for the inter-band transition involving the level $|1>$ as compared with the inter-band transition involving the level $\uparrow 2>$ (the radiative lifetime for the latter transition being of the order of 1 ns).

If necessary, the increasing of the thickness of the intermediate layer 20 permits the further reduction (and in a very effective manner) of the amplitude of this second extraneous phenomenon.

Finally, it will be noted that the latter possibly plays a part only in the initial phase of operation of the conversion device, since the levels $|1>$ and $|2>$ move further apart in terms of energy in the course of the operation of the device between two regenerations.

Furthermore, as has already been stated, the exchange energy within the electron gas is sufficient to cause a mutual shift of the levels $|1>$ and $|2>$ (of approximately 20 meV). The lifetime of the electron gas, associated with the direct radiative recombination with the gas of holes is thus always very large as compared with the response time of the conversion device.

The text which follows contains three further examples of semiconductor structures permitting the construction of a conversion device according to the present invention for other energy pairs (E1, E2).

One and the same value of E1 may, in general be obtained for heterostructures produced with different families of semiconductors (for example GaAs/GaAlAs on a substrate of GaAs, or (InGa)As/(InAl)As on a substrate of InP).

The choice of a family of semiconductors is, on the other hand, of decisive importance as regards the value of E2, since the radiative recombination takes place in the vicinity of the forbidden band energy of the material constituting one of the quantum wells.

Second example of a semiconductor structure

Conversion from the infrared range to the visible range: E1=144 meV (8.6 micrometers) and E2=1.77 eV (0.70 micrometer).
  layers 16, 24: $Ga_{0.5}Al_{0.5}As$
  layer 18: 6 nm of $Ga_{0.9}Al_{0.1}As$ which is N-doped at $3.3 \cdot 10^{17}$ cm$^{-3}$
  layer 20: 10 nm of $Ga_{0.67}Al_{0.33}As$
  layer 22: 6 nm of $Ga_{0.9}Al_{0.1}As$ which is P-doped at $3.3 \cdot 10^{17}$ cm$^{-3}$

Substrate: GaAs

The band configuration is the same as for the first example, but the composition in terms of aluminium has been increased by 10% for all the layers, in such a manner as to increase the energy E2 while maintaining E1.

Third example of a semiconductor structure

Conversion from the far infrared range to the near infrared range
  layers 16, 24: $Ga_{0.8}Al_{0.2}As$
  layer 18: 12 nm of GaAs which is N-doped at $1.7 \cdot 10^{17}$ cm$^{-3}$
  layer 20: 20 nm of $Ga_{0.95}Al_{0.05}As$
  layer 22: 12 nm of GaAs which is P-doped at $1.7 \cdot 10^{17}$ cm$^{-3}$

Substrate: GaAs

For this structure, E1 has the value of 31 meV (40 micrometers) and E2 has the value of 1.54 eV (0.8 micrometer) at low temperature (for example 77 K).

Fourth example of semiconductor structure

This example shows that it is also possible to convert an infrared radiation of shorter wavelength.
  layers 16, 24: $(In_{0.52}Al_{0.48})As$
  layers 18: 3.5 nm of $(Ga_{0.47}In_{0.53})As$ which is N-doped at $3 \cdot 10^{17}$ cm$^{-3}$
  layer 20: 10 nm of $(In_{0.52}Ga_{0.05}Al_{0.43})As$
  layer 22: 3.5 nm of $Ga_{0.47}In_{0.53}As$ which is P-doped at $3 \cdot 10^{17}$ cm$^{-3}$

Substrate: InP

In this case, E1 has the value of 310 meV (4 micrometers) and E2 has the value of 1.055 eV (1.15 Micrometer).

With regard to this fourth example, it will be noted that the selection of such a system of alloys matched in terms of lattice parameter to InP is of particular benefit, since the substrate is not an absorbing one for the radiation emitted by the corresponding conversion device.

This permits the extraction of this radiation through the rear face of the substrate, that is to say the face of this substrate which is opposite to the face carrying the stack of semiconductor layers.

The four examples have, of course, been given only on a purely indicative and in no sense limiting basis, it being possible for other families of semiconductors to be used in order to form semiconductor structures according to the present invention.

Given that the inter-miniband absorption coefficient varies with the density of the electron gas, it is possible to increase this coefficient and to reduce its relative variation in the course of the conversion operation, at constant transferred charge, by increasing the density of electron gas and thus by increasing the N-type doping of the layer 18.

In the present invention, instead of using coupled wells which are symmetrical and doped (the case of FIG. 2-B), it is possible to use coupled wells which are asymmetric and undoped, as is seen in FIG. 6-A.

This permits the avoidance of a trapping of the electrons on the donors at the low temperatures required for a processing of far infrared radiation.

The structure of FIG. 6-A is obtained by a stack of five semiconductor layers, namely:

two semiconductor layers capable of respectively forming two wells P1 and P2, P1 (or P2 respectively) being deeper than P2 (or P1 respectively) for the electrons (or for the holes respectively), a layer separating the two preceding layers and forming a potential barrier, these three layers being not intentionally doped, and two layers which frame the three preceding layers and respectively form two potential barriers.

The wells P1 and P2 have respectively localized electron levels $|1\rangle$ and $|2\rangle$ (base of electron minibands) such that the energy of the level $|1\rangle$ is less than that of the level $|2\rangle$.

The ground level of a miniband of greater energy is denoted $|3\rangle$ and delocalized within the structure, the probability density associated with this level $|3\rangle$ being greater in the vicinity of the level $|2\rangle$ than in the vicinity of the level $|1\rangle$.

If such a structure is illuminated at an energy greater than that of the inter-band transitions involving the delocalized level $|3\rangle$ and the first levels of holes $|t\rangle$ (situated principally within the semiconductor layer which forms the well P2), the situation achieved after irradiation and recombination of the excess carriers is represented in FIG. 6-B (FIG. 6-A corresponding to the situation which exists before such an irradiation).

A gas of holes is created within P2 and an electron gas is created within P1 and the probability density associated with the level $|3\rangle$ is approximately the same for the two wells P1 and P2.

The asymmetric semiconductor structure is thus prepared to operate as conversion device, just like the semiconductor structure corresponding to FIGS. 2-A and 2-B: absorption from the level $|1\rangle$ to the level $|3\rangle$, relaxation from the level $|3\rangle$ to the level $|2\rangle$ for a proportion of the electrons advanced and radiative recombination with holes of the gas of holes which is localized within P2.

Such a conversion device having an asymmetric semiconductor structure may operate down to very low temperatures (of the order of 4 K). It is accordingly particularly suitable for the processing of a far infrared radiation, but is also suitable for all the other conversion applications which may be envisaged for a device according to the invention, having a symmetrical semiconductor structure.

In order to obtain an asymmetric structure of the same type as that of FIG. 6-A, it is possible to proceed in various ways:

It is possible, for example, to use a stack of semiconductor layers, the materials of which are such that the asymmetric semiconductor structure in question is obtained.

It is possible, for example, to use a structure identical to that of the first example given hereinabove, except for the layers 18 and 22, constituting the wells P1 and P2, which would be respectively constituted by 6 nm of undoped GaAs and by 6 nm of undoped $(Ga_{0.9}Al_{0.04}In_{0.06})As$.

Another way of proceeding consists in forming a symmetrical structure of the same type as that of FIGS. 2-A and 2-B without doping of the layers 18 and 22 and applying to such a structure an electrical field permitting the wells P1 and P2 to be made asymetric. Such an electric field may be obtained by dopings which are localized and of opposite types from the layers 16 and 24.

In order to increase the effectiveness of the absorption phase at the energy E1, it is possible to use a semiconductor structure comprising not a single pattern of the type "layers 16-18-20-22-24" but a stack of the following type:

"layers 16-18-20-22-24-16-18-20-22-24- . . . -16-18-20-22-24".

In order to increase the effectiveness of the absorption phase at the energy E1, it is also possible to make the free face of the stack of semiconductor layers (leading to a symmetrical structure or to an asymmetric structure) optically reflective in relation to the radiation E1.

To this end, it is possible to deposit on the free face of this stack (the face opposite to that which rests on the substrate 2) a metallic layer 26, for example of gold, which is capable of reflecting the radiation of energy E1 (FIG. 7).

Use is then made of a substrate 2 which is transparent to this radiation of energy E1 and to the radiation of energy E2, as well as to the radiation from the light source 6 and the rear face of the substrate 2 (the face opposite to that which carries the stack of semiconductor layer (sic)) is then exposed to the radiation 10 of energy E1, at a suitable incidence.

Likewise recovery takes place of the radiation of energy E2 which emerges by this rear face, and the structure is illuminated, with a view to its regeneration by passing the radiation from the source 6 onto the rear face of the substrate 2.

Instead of using a substrate which is transparent to the radiation 10, to the radiation 14 and to the radiation from the source 6, it is possible to eliminate the substrate once the stack has been formed and to place this semiconductor stack on a support which is transparent to the three radiations under consideration.

In order to increase the effectiveness of the absorption phase, it is likewise possible to use (FIG. 8) a substrate 2, one end 28 of which is bevelled, for example at 45°.

The radiation 10 is then passed to the stack, normally to this face 28. This radiation 10 then propagates in a zig-zag path between the air-free face interface of the stack and the air-rear face interface of the substrate, leading to multiple passes of this radiation through the semiconductor stack.

The radiation of energy E2 is again, in this case, detected through the rear face of the substrate and illumination with a view to the regeneration of the device is again effected through this rear face.

This assumes that use is again made of a substrate transparent to the three radiations under consideration.

In the construction of FIG. 8 it is again possible to cover the free surface of the stack 4 with a layer 26 which is optically reflective in relation to the radiation 10 of energy E1.

In particular, the deposit of a metallic reflective layer is important for the optimal operation of the device in the case of a thin stack (a stack having a thickness of a few micrometers).

Supplementary layers may be added to the simple structure of FIG. 2-A, in order to improve the operation of the conversion device incorporating this structure.

In particular, this may be done to obtain a structure for which the absorption at the energy E1 is intensified (an increase in the oscillatory force of the inter-miniband transition), while preserving equality of the probabilities of relaxation from the $|3\rangle$ to the level $|1\rangle$ or the level $|2\rangle$, that is to say approximately equality of the probabilities of presence in the vicinity of the two wells, or to adjust with greater flexibility, for a given family of materials, the gaps between energy levels, or to extend the respective ranges of the values of E1 and E2 for a given family of materials.

Thus it is that it is possible, for example, to modify the structure represented in FIG. 2-A by providing, as can be seen in FIG. 9-A, at the center of the semiconductor layer 20 corresponding to the intermediate barrier, a "repulsive" layer 30 of small thickness, for example a layer of AlAs of 0.3 nm, permitting a reduction of the probability of presence of the electrons from the level $|3>$ in the layer 20.

To this end, after having formed the semiconductor layer 18, there is formed a part 20b of the layer 20, then the layer 30 and then the remainder 20b of the layer 20.

We claim:

1. Device for the conversion of an infrared radiation into another radiation of energy greater than that of this infrared radiation, characterized in that it comprises a multilayer semiconductor structure (4) comprising at least one first semiconductor layer (18) and at least one second semiconductor layer (22), in which layers there are respectively confined an electron gas and a gas of holes, or in which layers it is possible to confine respectively an electron gas and a gas of holes, the structure being such that there is at least one delocalized electron state ($|3>$) in at least the first and the second layers, this delocalized state having an energy greater than that of the electrons of the electron gas, the difference between the energy of the delocalized state ($|3>|$) and that of the ground state ($|1>$) of the electron gas being within the infrared range, so that when the structure is illuminated in a manner not perpendicular to the layers by a first radiation which is within the infrared range and the energy (E1) of which is equal to the difference between the energy of the delocalized state and that of the ground state of the electron gas, this structure emits a second radiation of energy (E2) greater than that of the first, by radiative recombination involving the holes of the gas of holes, and in that the device further comprises means (6) for regenerating, or for creating before use of the device and then regenerating, the electron gas and the gas of holes.

2. Device according to claim 1, characterized in that the structure (4) is a symmetrical structure, the first (18) and the second (22) layers of which respectively form coupled quantum wells (P1, P2), of the same depth and doped, their respective dopings being of opposite types, the device then comprising means (6) for regenerating the electron gas and the gas of holes.

3. Device according to claim 2, characterized in that the first layer (18) is made of a semiconductor material with N-type doping, in that the second layer (22) is made of this same semiconductor material but with a P-type doping and in that the first layer and the second layer are separated by third semiconductor layer (20), which is not doped and which forms a potential barrier for the electrons and for the holes, the assembly comprising the first, the second and the third layers being framed by two semiconductor layers (16, 24) which are not doped intentionally, forming potential barriers for the electrons and for the holes.

4. Device according to claim 1, characterized in that the structure (4) is an asymmetric structure, the first (18) and the second (22) layers of which respectively form coupled quantum wells (P1, P2), which are not doped where the ground level of electrons and the ground level of holes are, confined respectively within the first and the second layers, the device then comprising means (6) for creating, before use of the device, and then regenerating the electron gas and the gas of holes.

5. Device according to claim 1, characterized in that the structure comprises a plurality of patterns, each pattern comprising the first (18) and the second (22) semiconductor layers.

6. Device according to claim 1, characterized in that the structure (4) rests on a substrate (2) transparent to the first (10) and second (14) radiations and comprises a free surface which is made optically reflective in relation to the first radiation (10).

7. Device according to claim 1, characterized in that the structure (4) rests on a substrate (2) which is transparent to the first radiation (10) and one end (28) of which is bevelled and intended to receive this first radiation.

8. Device according to claim 1, characterized in that said means are illumination means provided for illuminating the structure by a radiation capable of regenerating, or creating before use of the device and then regenerating, the electron gas and the gas of holes.

9. Device according to claim 2, characterized in that the structure comprises a plurality of patterns, each pattern comprising the first (18) and the second (22) semiconductor layers.

10. Device according to claim 2, characterized in that the structure (4) rests on a substrate (2) transparent to the first (10) and second (14) radiations and comprises a free surface which is made optically reflective in relation to the first radiation (10).

11. Device according to claim 2, characterized in that the structure (4) rests on a substrate (2) which is transparent to the first radiation (10) and one end (28) of which is bevelled and intended to receive this first radiation.

12. Device according to claim 2, characterized in that said means are illumination means provided for illuminating the structure by a radiation capable of regenerating, or creating before use of the device and then regenerating, the electron gas and the gas of holes.

13. Device according to claim 3, characterized in that the structure comprises a plurality of patterns, each pattern comprising the first (18) and the second (22) semiconductor layers.

14. Device according to claim 3, characterized in that the structure (4) rests on a substrate (2) transparent to the first (10) and second (14) radiations and comprises a free surface which is made optically reflective in relation to the first radiation (10).

15. Device according to claim 3, characterized in that the structure (4) rests on a substrate (2) which is transparent to the first radiation (10) and one end (28) of which is bevelled and intended to receive this first radiation.

16. Device according to claim 3, characterized in that said means are illumination means provided for illuminating the structure by a radiation capable of regenerating, or creating before use of the device and then regenerating, the electron gas and the gas of holes.

17. Device according to claim 4, characterized in that the structure comprises a plurality of patterns, each pattern comprising the first (18) and the second (22) semiconductor layers.

18. Device according to claim 4, characterized in that the structure (4) rests on a substrate (2) transparent to the first (10) and second (14) radiations and comprises a free surface which is made optically reflective in relation to the first radiation (10).

19. Device according to claim 4, characterized in that the structure (4) rests on a substrate (2) which is transparent to the first radiation (10) and one end (28) of which is bevelled and intended to receive this first radiation.

20. Device according to claim 4, characterized in that said means are illumination means provided for illuminating the structure by a radiation capable of regenerating, or creating before use of the device and then regenerating, the electron gas and the gas of holes.

21. Device according to claim 1, characterized in that the structure is a symmetric structure, the first and second layers of which respectively form coupled quantum wells which are not doped, the device comprising means for applying to the structure an electric field which makes said structure asymmetric so that the ground level of electrons and the ground level of holes are for the most part confined respectively within the first and the second layers, the device then comprising means for creating, before use of the device, and then regenerating the electron gas and the gas of holes.

* * * * *

UNITED STATES PATENT AND TRADEMARK OFFICE
CERTIFICATE OF CORRECTION

PATENT NO.  : 5,160,992

DATED       : November 3, 1992

INVENTOR(S) : Jean-Michel GERARD, et al

It is certified that error appears in the above-identified patent and that said Letters Patent is hereby corrected as shown below:

Col., 13, line 61 (Claim 3, line 11) "intentionally" should be deleted.

Col., 13, line 68 (Claim 4, line 6) after "level of holes are," insert -- for the most part --.

Signed and Sealed this

Eighteenth Day of January, 1994

Attest:

BRUCE LEHMAN

Attesting Officer

Commissioner of Patents and Trademarks